(12) United States Patent
Czipott et al.

(10) Patent No.: US 7,577,544 B2
(45) Date of Patent: Aug. 18, 2009

(54) METHOD AND SYSTEM FOR IMPROVING TARGET LOCALIZATION AND CHARACTERIZATION

(75) Inventors: Peter Victor Czipott, San Diego, CA (US); David Oliver Walsh, Mukilteo, WA (US); Alexander Robert Perry, San Diego, CA (US)

(73) Assignee: GE Homeland Protection, Inc., Newark, CA (US)

( * ) Notice: Subject to any disclaimer, the term of this patent is extended or adjusted under 35 U.S.C. 154(b) by 28 days.

(21) Appl. No.: 11/768,453

(22) Filed: Jun. 26, 2007

(65) Prior Publication Data
US 2009/0006009 A1    Jan. 1, 2009

(51) Int. Cl.
*G01C 9/00* (2006.01)
(52) U.S. Cl. ............... 702/150; 702/6; 702/94; 702/95; 324/179; 324/333; 324/345; 324/377
(58) Field of Classification Search ......... 702/6, 702/94, 95, 150; 324/179, 333, 345, 377
See application file for complete search history.

(56) References Cited

U.S. PATENT DOCUMENTS

| 4,920,313 | A | 4/1990 | Constant |
| 5,777,477 | A * | 7/1998 | Wynn ............... 324/345 |
| 6,278,948 | B1 | 8/2001 | Jorgensen et al. |
| 6,424,918 | B1 | 7/2002 | Jorgensen et al. |
| 6,430,507 | B1 | 8/2002 | Jorgensen et al. |
| 6,502,037 | B1 | 12/2002 | Jorgensen et al. |
| 6,668,218 | B1 | 12/2003 | Bulow et al. |
| 6,988,049 | B1 | 1/2006 | Wirtz et al. |
| 6,993,433 | B2 | 1/2006 | Chavarria et al. |
| 7,227,466 | B2 | 6/2007 | Nelson |
| 2007/0181028 | A1 | 8/2007 | Schmidt et al. |
| 2008/0211507 | A1 * | 9/2008 | Zhdanov ............... 324/333 |

* cited by examiner

*Primary Examiner*—Tung S Lau
*Assistant Examiner*—Sujoy K Kundu
(74) *Attorney, Agent, or Firm*—Eugene Hyun, Esq.; Armstrong Teasdale LLP (57) ABSTRACT

A method for determining a location and characterization of an object using a magnetic gradient tensor measurement of the object is provided. The method includes determining an object magnetic field candidate predicted from one of an object measured magnetic field gradient and an assumed object magnetic moment magnitude, and determining an object vector location and an object vector magnetic moment by combining the object magnetic field candidate with an object measured magnetic field.

20 Claims, 5 Drawing Sheets

| | |
|---|---|
| COORDINATES OF ORIGIN | 132 |
| COORDINATES OF VERTEX-12 | 134 |
| COORDINATES OF VERTEX-14 | 136 |
| COORDINATES OF VERTEX-16 | 138 |
| LENGTH OF GRADIOMETER SIDES, L | 140 |
| MAGNETOMETER/SENSOR NOISE THRESHOLD | 142 |
| MAGNETIC FIELD AT VERTEX-12, $_{12}B_x$ | 144 |
| MAGNETIC FIELD AT VERTEX-12, $_{12}B_y$ | 146 |
| MAGNETIC FIELD AT VERTEX-12, $_{12}B_z$ | 148 |
| MAGNETIC FIELD AT VERTEX-14, $_{14}B_x$ | 150 |
| MAGNETIC FIELD AT VERTEX-14, $_{14}B_y$ | 152 |
| MAGNETIC FIELD AT VERTEX-14, $_{14}B_z$ | 154 |
| MAGNETIC FIELD AT VERTEX-16, $_{16}B_x$ | 156 |
| MAGNETIC FIELD AT VERTEX-16, $_{16}B_y$ | 158 |
| MAGNETIC FIELD AT VERTEX-16, $_{16}B_z$ | 160 |
| GRADIENT $G_{xx}$ | 162 |
| GRADIENT $G_{yx}$ | 164 |
| GRADIENT $G_{zx}$ | 166 |
| GRADIENT $G_{yy}$ | 168 |
| GRADIENT $G_{zy}$ | 170 |
| TENSOR MAGNITUDE | 172 |
| COMPUTER PROGRAMS | 174 |
| MEASURED MAGNETIC FIELD | 176 |

METHOD AND SYSTEM FOR IMPROVING TARGET LOCALIZATION AND CHARACTERIZATION

BACKGROUND OF THE INVENTION

This invention relates generally to detecting targets, and more particularly, to methods and systems for locating and characterizing targets using magnetic gradiometry.

Military installations have artillery bombing ranges for target practice. Most of the bombs explode, however some may not and they bury themselves upon impact. Many military installations are to be closed or have been closed and the land will eventually be returned to the public. Disposing of unexploded ordnance involves locating, identifying, excavating and physically removing the ordnance.

Most of the unexploded ordnance removal cost is incurred during excavating as a result of inaccurate ordnance identifications. Ferromagnetic metal objects have strong magnetic fields. Because most ordnance is fabricated from ferromagnetic metal, unexploded ordnance is/are magnetic objects having magnetic fields. Locating magnetic objects of unknown properties involves determining six unknown quantities: three representing the object's location, and three representing its vector magnetic moment. The magnetic gradient tensor includes only five independent quantities. One of Maxwell's Equations is $\nabla \cdot B = 0$ everywhere, so the tensor is traceless. Another of Maxwell's Equations reduces to $\nabla \times B = 0$ in free space, so the tensor is symmetric. In the preceding equations B represents the magnetic field, $\nabla \cdot$ represents the divergence of the magnetic field vectors and $\nabla \times$ represents the curl of the magnetic field vectors. Thus, of the nine available tensor elements, four are redundant and five are independent. So, a single tensor gradiometer measurement is inadequate for determining all six unknowns. Using current techniques, the bearing to an object may be determined, but the moment and magnitude of the object are inextricable, so that a nearby small object cannot be distinguished from a distant large one. Furthermore, using current techniques, the symmetry of the dipole gradient means that there are four mathematical bearing solutions, one of which is the actual bearing and the others of which are so-called "ghost" solutions.

The inversion of magnetic tensor gradient data, regardless of which algorithm is used, yields four equally feasible pairs of solutions. There are magnetically degenerate special cases that have two equally feasible solutions, where each degenerate solution is found twice. Each of the four solutions includes a direction vector from a sensor, or the centroid of an array of sensors known as a gradiometer, toward the dipole position, and an orientation vector for the axis of the magnetic dipole. These can be considered as two pairs of solutions, where each pair has its two positions on opposite sides of the sensor, or gradiometer, and its dipoles pointing in opposite directions. That is, each pair is symmetric via reflection through the origin where the origin defines the sensor, or gradiometer, location.

Several methods determine which pair of solutions is the most likely, namely: geometric; moment magnitude; moment orientation; and kinetics. The geometric method requires that the solution not be underground, not be more than two meters in the air, not be behind the sensor or not experience some other constraint that may be derived from the situation. Using the moment magnitude method, a solution which is not the actual one implies the presence of materials whose magnetic properties are not physically available, or unlikely in the situation. With the moment orientation method, if the object is known to be magnetically permeable with negligible remnant moment, the dipole axis is aligned with the earth's magnetic field. Using the kinetics method, the track of positions over time implies feasible speeds and accelerations. None of these methods is generally valid for all situations because each of them relies on particular criteria that correspond to a given application, deployment, or situation.

There are many situations where the geometric, moment magnitude, moment orientation and kinetics methods are inapplicable and/or insufficient. For example, dipole orientation cannot be used for objects whose remnant magnetization exceeds the induced magnetization. Similarly, the geometric method cannot be used to eliminate a hemisphere when a target can be on either side of the sensor. Although the four pairs of solutions equivalently satisfy the constraints of the tensor gradient data, there are three additional constraint values available from the magnetic field vector.

The first constraint, corresponding to the magnitude of the magnetic field due to the dipole, is independent of the four pairs of solutions. The first constraint serves to scale the four normalized orientation (or bearing) vectors, and the corresponding normalized dipole vectors, to have the correct positional range and magnetic dipole moment.

The second constraint unambiguously selects one solution from each pair. Reversing the orientation of the dipole changes the sign of both the gradient and the magnetic field, but reversing the orientation (or bearing) vector only changes the sign of the gradient, not the magnetic field. Consequently, if the magnetic field vector is computed for each of the two solutions in a pair, one of the computed vectors will be similar to the measured magnetic field vector and the other will be approximately reversed. The solution corresponding to the non-reversed magnetic field vector is the desired solution in any pair of tracking solutions.

The final constraint is used to choose from among the two remaining solution candidates by inspecting those measured and computed magnetic field vectors more closely. One of the two computed magnetic field vectors will correspond more closely, in direction, with the actual magnetic field vector for the dipole than the other vector. Generally, the magnetic field vector corresponding more closely with the actual magnetic field vector direction corresponds to the desired solution. In the presence of significant measurement noise, notably correlated noise, statistical techniques can be used to infer the confidence values for the two solution options.

Magnetic field gradiometers measure the spatial derivatives, $\partial/\partial x_i$, where i=1,2,3, of each vector component $B_j$, where j=1,2,3, of the ambient magnetic field. In the exemplary embodiment, the ambient magnetic field is simply that of the earth. However, it should be appreciated that in various other exemplary embodiments the ambient magnetic field may be an artificially generated field, or in spaceborne uses, the ambient field of the sun or another planet. Because there are three magnetic field components, each of which can be differentiated in three directions, the full gradient is a 3×3 tensor having nine components $\partial B_j/\partial x$. Magnetic field gradiometers used in non-conducting environments have constraints imposed by Maxwell's equations so that not all of the nine tensor components need be measured. Consequently, in most circumstances, only five of the nine tensor components are independent of one another and the other four tensor components can be computed using the five independent tensor components. Maxwell's Equation $\nabla \cdot B = 0$ means that the tensor has a zero trace, so that any one of the diagonal terms is the negative of the sum of the other two. In free space, where there is zero electric current, another of Maxwell's Equations reduces to $\nabla \times B = 0$, which means that the tensor is symmetric: that is for i≠j, $\partial B_i/\partial x_j = \partial B_j/\partial x_i$.

Figure 1:
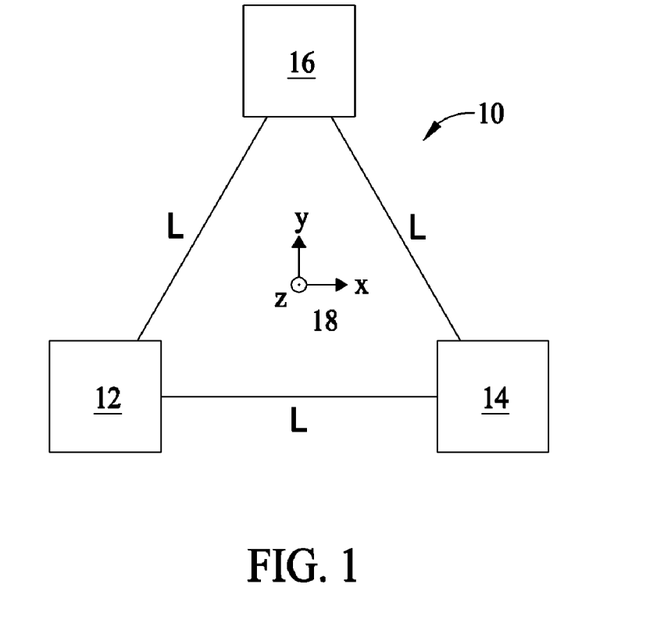
FIG. 1 illustrates a triangular gradiometer with three-axis sensors.

FIG. 1 shows a configuration of magnetic sensors used for measuring approximations to the five independent components of the gradient tensor. In the exemplary embodiment three sensing elements, or magnetometer sensors 12, 14, 16, are arranged in an array to form a triangular sensing system configuration defining a gradiometer 10 having an equilateral triangular shape. Each of the magnetometers 12, 14, 16 operates digitally and may be internally controlled using a digital signal processor (DSP) or field programmable gate array (FPGA). Because the magnetometers 12, 14, 16 operate digitally, the output data is in digital form rather than analog form. Additionally, each of the magnetometers 12, 14, 16 is disposed in a vertex of the equilateral triangular gradiometer 10 and measures the magnetic field components $B_x$, $B_y$, $B_z$, where the z-axis is oriented to come out of the page. Each side of the equilateral triangular gradiometer 10 has a length L. Using the centroid 18 of the equilateral triangular gradiometer 10 as the origin for computations, the coordinates of the center of the three magnetometers 12, 14, 16 are (-L/2, -L/2(3)$^{1/2}$), (L/2, -L/2(3)$^{1/2}$), and (0, L/(3)$^{1/2}$), respectively. The magnetic field measured at each vertex, k, is denoted as $_kB$, with components $_kB_x$, $_kB_y$, and $_kB_z$ where k corresponds to the appropriate magnetometer 12, 14, 16.

Figure 2:
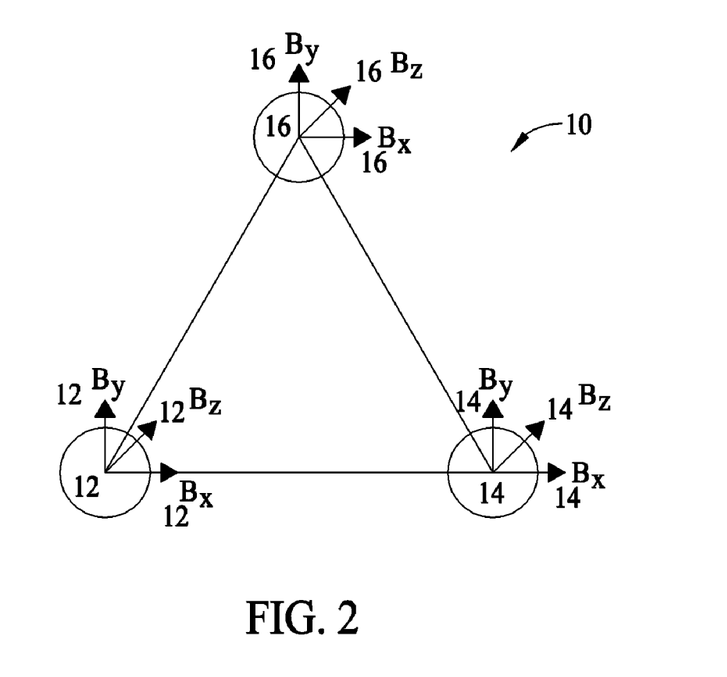
FIG. 2 illustrates the X, Y, and Z components of the magnetic field B measured by each sensor shown in FIG. 1.

FIG. 2 shows the $B_x$, $B_y$, $B_z$ components of the magnetic field B measured by each magnetometer 12, 14, 16 disposed at each vertex k. It should be appreciated that at least three magnetometers should be included in the gradiometer 10. Additionally, it should be appreciated that the magnetometers 12, 14, 16 may not lie along the same line because this type of configuration also yields inadequate data for practicing the invention. The three magnetometers 12, 14, 16 may be arranged in any triangular configuration as long as the length, L, of each side of the triangular gradiometer 10 is accounted for. It should be further appreciated that more than three magnetometers 12, 14, 16 may be used to form the gradiometer 10, and that the gradiometer 10 may have any of several geometric configurations. However, the gradiometer 10 may not be configured to place the magnetometers 12, 14, 16 colinearly, e.g., arranged to lie along the same line.

In the exemplary embodiment, the gradient tensor component $\partial B_x/\partial x$ is estimated by taking its finite-difference approximation given by the formula $[_{14}B_x - _{12}B_x]/L$. Similarly, the five independent tensor gradient components are determined as follows:

$$G_{xx} = \partial B_x/\partial x \sim [_{14}B_x - _{12}B_x]/L;$$

$$G_{yx} = \partial B_y/\partial x \sim [_{14}B_y - _{12}B_y]/L;$$

$$G_{zx} = \partial B_z/\partial x \sim [_{14}B_z - _{12}B_z]/L;$$

$$G_{yy} = \partial B_y/\partial y \sim [_{16}B_y - (_{12}B_y + _{14}B_y)/2] \times (2/(3)^{1/2})/L; \text{ and}$$

$$G_{zy} = \partial B_z/\partial y \sim [_{16}B_z - (_{12}B_z + _{14}B_z)/2] \times (2/(3)^{1/2})/L.$$

It should be appreciated that there may also be a sixth finite difference result equivalent to one of the five indicated above. In particular, for gradiometer 10, the sixth finite difference is given by $G_{xy} = \partial B_x/\partial y \sim [_{16}B_x - (_{12}B_x + _{14}B_x)/2] \times (2/(3)^{1/2})/L$. It should be understood that because the tensor is symmetric, $G_{xy} = G_{yx}$.

Due to the traceless and symmetric features of the gradient tensor matrix, measurement of five independent tensor components can be used to completely determine the full, nine component gradient tensor. Traceless is where the sum of matrix elements on the principal diagonal of the matrix is zero. Symmetric is where the matrix elements across the diagonal are equal. To verify that a given set of gradients specifies the tensor, two gradients should be diagonal terms of the 3×3 matrix and the other three should be off-diagonal terms on one side of the diagonal. It should be understood that the three off diagonal terms should not include a pair of the form $\partial B_i/\partial x_j$ and $\partial B_j/\partial x_i$ because such two are redundant. An example of such a pair is $G_{xy}$ and $G_{yx}$. In the exemplary embodiment, the two diagonal terms are $G_{xx}$ and $G_{yy}$, and the three off diagonal terms on one side of the diagonal are $G_{yx}$, $G_{zx}$, and $G_{zy}$. The gradiometer 10 measures the magnetic field as well as the gradients. Any one of the magnetometers 12, 14, 16 of the gradiometer 10 also determines a measured magnetic field. The magnetic field components at the centroid 18 of the gradiometer 10 can be approximated as $B_i \sim [_{12}B_i + _{14}B_i + _{16}B_i]/3$, where i=x,y,z.

Figure 3:
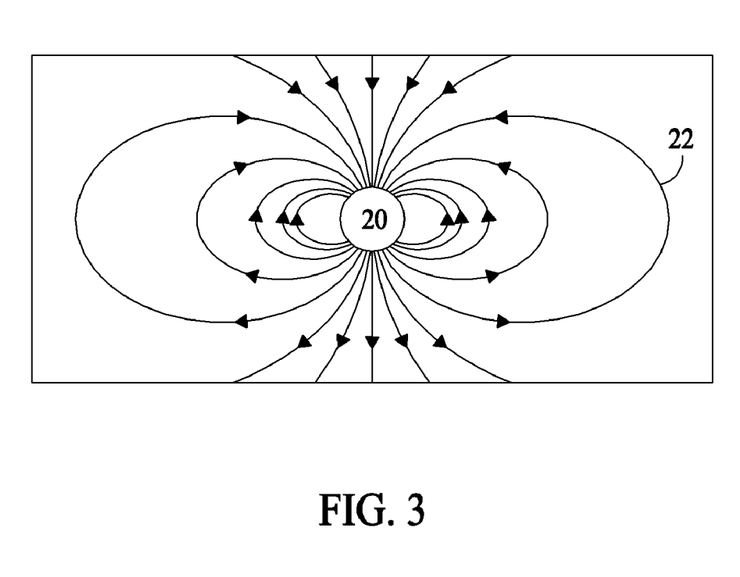
FIG. 3 illustrates a dipole magnetic field where the circle at the center represents the size of the source relative to the scale of the field structure.

As discussed previously, in the exemplary embodiment the ambient magnetic field is simply that of the earth, although in other various exemplary embodiments the ambient magnetic field may be an artificially generated field or that of the sun or another planet. FIG. 3 generally shows a dipole magnetic field where the circle at the center represents the size of the source, relative to the scale of the magnetic field structure. Where the source is the earth 20, its magnetic field 22 is generally smoothly varying and the scale length of those variations, of the order of the distance from the surface to the center of the earth 20, is huge compared to the gradiometer 10, so gradients associated with the earth's field 22 are very small.

Figure 4:
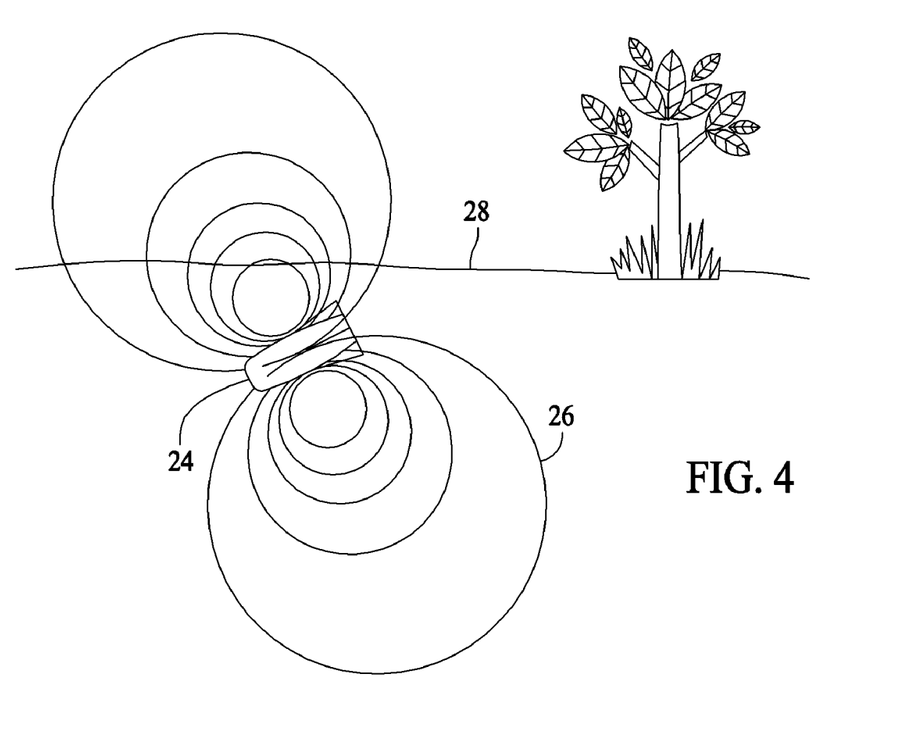
FIG. 4 illustrates a buried unexploded artillery shell and its dipole magnetic field.

FIG. 4 shows an unexploded artillery shell or unexploded ordnance (UXO) 24 and its dipole magnetic field 26 disposed in a location 28. In the exemplary embodiment the UXO 24 is located in a firing range 28. Artillery shells are made from steel which has a large magnetic permeability. The steel's large magnetic permeability concentrates the earth's magnetic field 22 inside the artillery shell steel, so that a dipole magnetic field 26 forms a local dipole magnetic field perturbation that is superimposed on the ambient magnetic field 22 of the earth 20. Because the artillery shell is small and close, relative to the center of the earth, to the gradiometer 10, the magnetic field gradients of the artillery shell 24 as well as the artillery shell's magnetic field 26 can be of appreciable magnitude. The gradiometer 10 senses the magnetic field gradients and magnetic field perturbations of the unexploded artillery shell 24 and of the unexploded artillery shell's magnetic field 26. In the exemplary embodiment, the buried artillery shell's magnetic field 26 penetrates the soil and extends above the surface of the firing range 28 largely unaffected by the soil. However, where the soil has an unusually high ferrous content, the soil has an inherent magnetic permeability which distorts the artillery shell's magnetic field 26, but does not prevent the magnetic field 26 from extending above the surface of the firing range 28.

There is needed a method for accurately locating and classifying unexploded ordnance by resolving the range-moment ambiguity, without imposing situation dependent constraints, and eliminating "ghost" solutions.

BRIEF DESCRIPTION OF THE INVENTION

In one exemplary embodiment, a method for determining a location and characterization of an object using a magnetic gradient tensor measurement of the object is provided. The method includes determining an object magnetic field candidate predicted from one of an object measured magnetic field gradient and an assumed object magnetic moment magnitude, determining an object vector location and an object vector magnetic moment by combining the object magnetic field candidate with an object measured magnetic field, and determining a plurality of magnetic field candidates, where each of the plurality of magnetic field candidates is predicted from one of an object measured magnetic field candidate and an assumed object magnetic moment magnitude. The method also includes computing a plurality of correlation coefficients, where each of the plurality of correlation coefficients corresponds to a different one of the plurality of magnetic field candidates and the object measured magnetic field. Each of the plurality of correlation coefficients is calculated according to the formula $C=(B^T\tilde{B}_i)/(\tilde{B}_i^T\tilde{B}_i)$ where C is a correlation coefficient, $B^T$ is a measured magnetic field, $\tilde{B}_i$ is the predicted $i^{th}$ magnetic field candidate and i is a number of candidates.

In another exemplary embodiment a system for locating and characterizing an object is provided. The system includes a gradiometer having a plurality of sensors, a display and a controller. The controller determines an object bearing vector and an object magnitude moment. The controller calculates a plurality of correlation coefficients between an object predicted magnetic field candidate and an object measured magnetic field. Each of the plurality of correlation coefficients is calculated according to the formula $C=(B^T\tilde{B}_i)/(\tilde{B}_i^T\tilde{B}_i)$ where C is a correlation coefficient, $B^T$ is a measured magnetic field, $\tilde{B}_i$ is the predicted $i^{th}$ magnetic field candidate and i is a number of candidates.

In yet another exemplary embodiment a computer program is disclosed. The computer program includes instructions, which when read and executed by a controller, cause the controller to determine an object vector bearing-and an object magnetic moment axis orientation by combining an object predicted magnetic field candidate with an object measured magnetic field. The controller computes a plurality of correlation coefficients, each of the plurality of correlation coefficients corresponds to the object predicted magnetic field candidate and the object measured magnetic field data. The correlation coefficient is calculated according to the formula $C=(B^T\tilde{B}_i)/(\tilde{B}_i^T\tilde{B}_i)$ where C is the correlation coefficient, $B^T$ is the measured magnetic field data, $\tilde{B}_i$ is the predicted magnetic field candidate data and is a number of candidates.

DETAILED DESCRIPTION OF THE INVENTION

Figure 5:
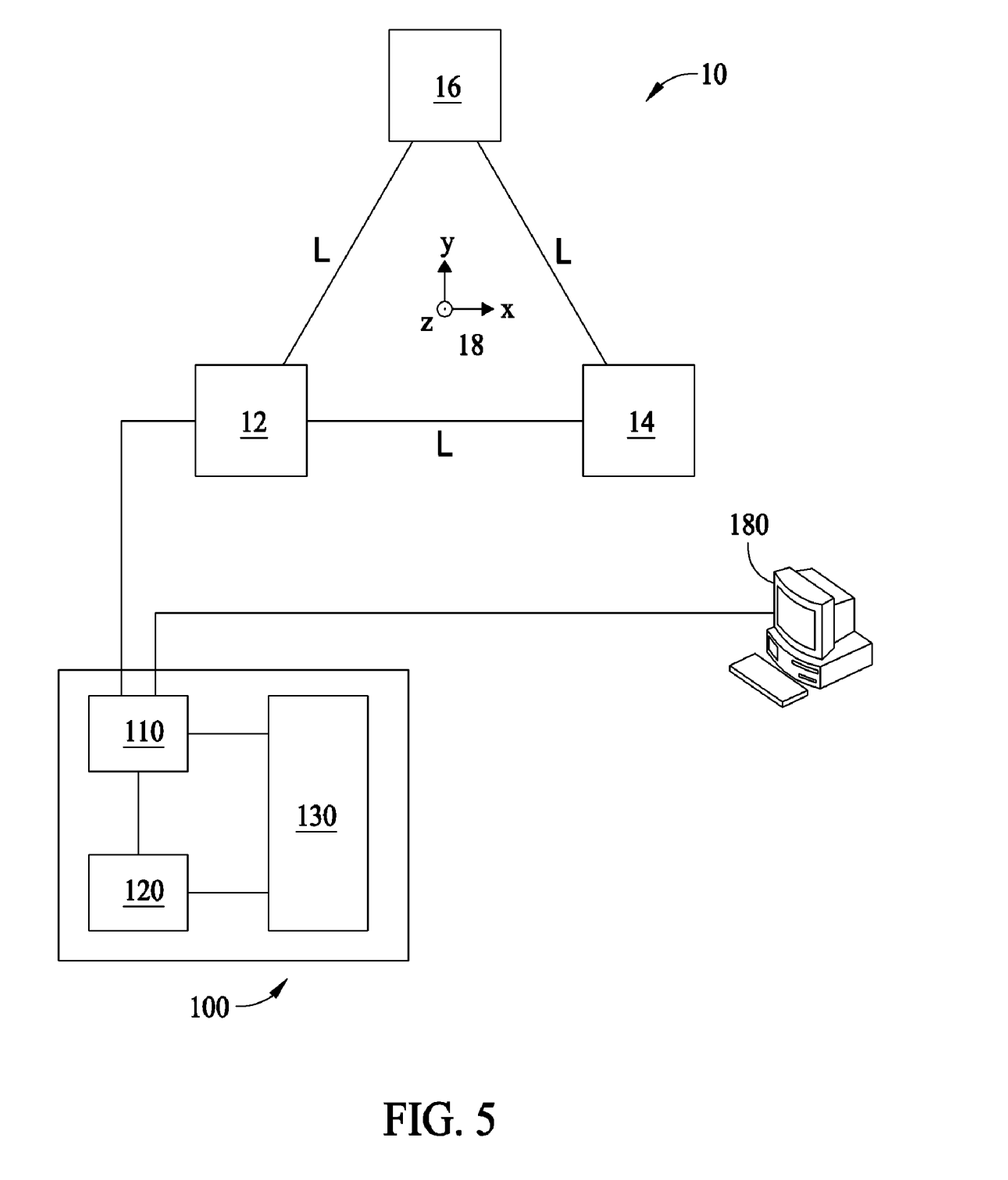
FIG. 5 is a diagram showing a controller for an exemplary embodiment of the invention.

FIG. 5 shows the locating and characterizing system of the exemplary embodiment including a controller 100 having an input/output circuit 110, a processing circuit 120 and memory 130. The gradiometer 10 communicates with the controller 100 by sending electrical signals corresponding to the magnetic field data from each magnetometer 12, 14, 16 to the input/output circuit 110 of the controller 100 for determining an object's location and classification. The controller 100 communicates with the gradiometer 10 and with the display 180. The display 180 notifies a user regarding the UXO 24 location and corresponding classification.

It should be understood that each of the circuits of controller 100 shown in FIG. 5 can be implemented as portions of a suitably programmed general purpose computer. Alternatively, each of the circuits shown in FIG. 5 can be implemented as physically distinct hardware circuits within an ASIC (Application-Specific Integrated Circuit), or using a DSP (Digital Signal Processor), FPGA (Field-Programable Gate Array), a PLD (Programmable Logic Device), a PLA (Programmable Logic Array), or a PAL (Programmable Array Logic), or using discrete logic elements or discrete circuit elements.

The input/output interface circuit 110 receives signals sent to the controller 100 from sources such as the gradiometer 10. In the exemplary embodiment, the controller 100 receives electrical signals from the gradiometer 10 corresponding to the magnetic field data detected by each magnetometer 12, 14, 16. Additionally, the input/output interface circuit 110 outputs signals produced by the location and characterization system controller 100.

Figure 6:
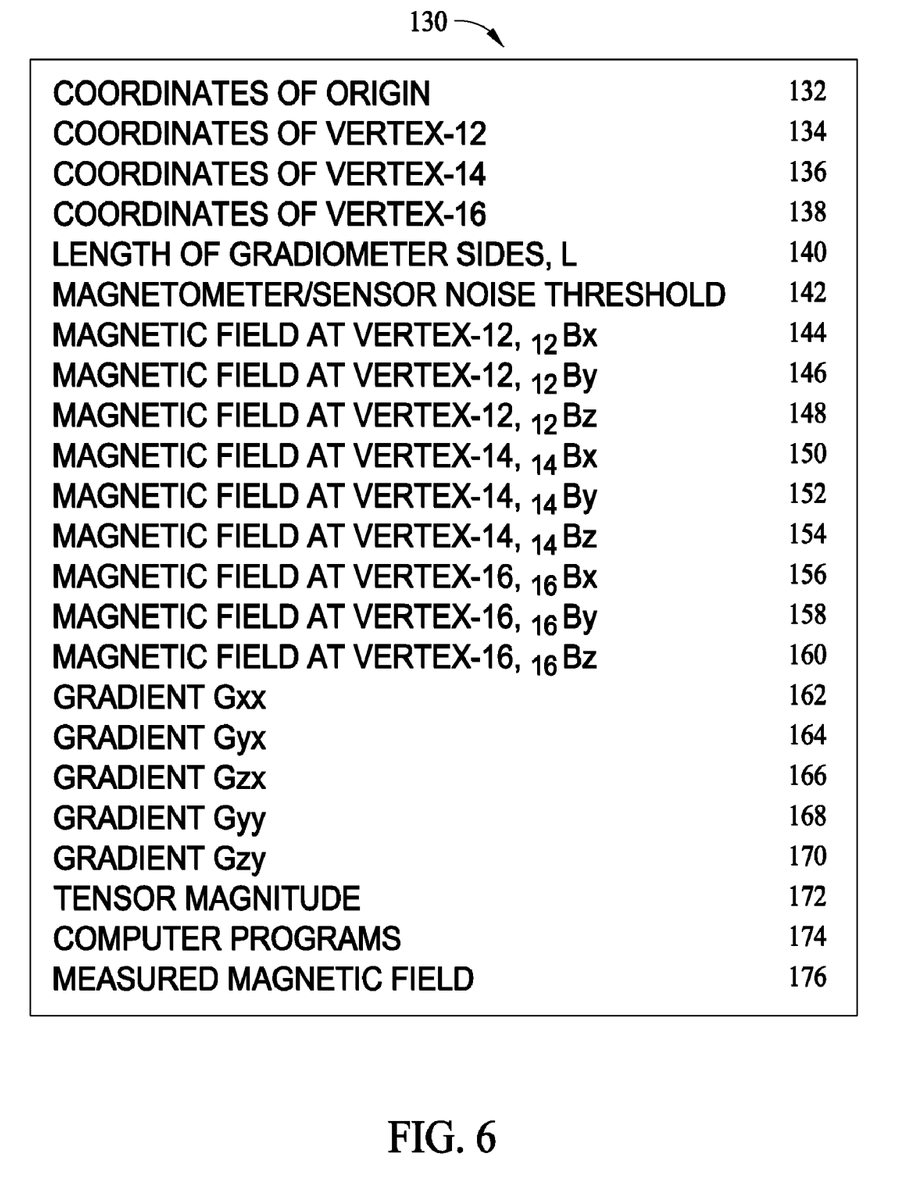
FIG. 6 is a diagram showing a memory for the exemplary embodiment of the invention.

As shown in FIG. 6, the memory 130 can include one or more of an origin coordinates portion 132; coordinates of each vertex portion 134, 136, 138; length of the gradiometer sides portion 140; magnetometer noise threshold portion 142; the magnetic field components at vertex-12 portion 144, 146, 148; magnetic field components at vertex-14 portion 150, 152, 154; magnetic field components at vertex-16 portion 156, 158, 160; gradient $G_{xx}$ portion 162; gradient $G_{yx}$ portion 164; gradient $G_{zx}$ portion 166; gradient $G_{yy}$ portion 168; gradient $G_{zy}$ portion 170; the tensor magnitude portion 172; a computer programs portion 174; and a measured magnetic field portion 176.

The origin coordinates portion 132 stores the coordinates of the centroid 18 of the gradiometer 10. The coordinates of each vertex portion 134, 136, 138 stores the coordinates of each vertex k 12, 14, 16, respectively. The length of the gradiometer sides portion 140 stores the length of the sides of the gradiometer 10. It should be appreciated that when the gradiometer 10 is configured as a non-equilateral triangle, three lengths should be stored. When the gradiometer 10 is configured as other than a triangle, the number of lengths stored should correspond to the number of sides of the particular configuration. The magnetometer noise portion 142 stores a noise threshold value common to each magnetometer 12, 14, 16. It should be appreciated that when the magnetometers 12, 14, 16 each have different noise threshold values, additional memory should be provided corresponding to each threshold value. The magnetic field components at vertex-12 portion 144, 146, 148, stores the magnetic field components $_{12}B_x, _{12}B_y, _{12}B_z$ at vertex-12. The magnetic field components at vertex-14 portion 150, 152, 154, stores the magnetic field components $_{14}B_x, _{14}B_y, _{14}B_z$ at vertex-14. The magnetic field components at vertex-16 portion 156, 158, 160, stores the magnetic field components $_{16}B_x, _{16}B_y, _{16}B_z$ at vertex-16. The gradient portions $G_{xx}$ 162, $G_{yx}$ 164, $G_{zx}$ 166, $G_{yy}$ 168 and $G_{zy}$ 170 store the gradients computed using the magnetic field components stored at each vertex k 12, 14, 16 portion 144-160. The tensor magnitude portion 172 stores the computed value of the tensor magnitude. The computer programs portion 174 stores instructions implemented by the controller. The measured magnetic field portion 176 stores the measured magnetic field determined by any one of the magnetometers 12, 14, 16 of the gradiometer 10.

The memory 130 can be implemented using any appropriate combination of alterable, volatile or non-volatile memory or non-alterable, or fixed, memory. The alterable memory, whether volatile or non-volatile, can be implemented using any one or more of static or dynamic RAM (Random Access Memory), a floppy disk and disk drive, a writeable or re-writeable optical disk and disk drive, a hard drive, flash memory or the like. Similarly, the non-alterable or fixed memory can be implemented using any one or more of ROM (Read-Only Memory), PROM (Programmable Read-Only Memory), EPROM (Erasable Programmable Read-Only Memory), EEPROM (Electrically Erasable Programmable Read-Only Memory), an optical ROM disk, such as a CD-ROM or DVD-ROM disk, and disk drive or the like.

Referring back to FIG. 5, in the exemplary embodiment the processing circuit 120 performs many different calculations, including determining the magnetic vector field, the magnetic tensor magnitude, the tensor gradients and the gradient noise, G. The processing circuit 120 also verifies that the magnetic tensor magnitude is less than the gradiometer's 10 noise threshold, also defined as the gradient noise. The gradient noise is a limit that the magnetic tensor magnitude should not exceed unless UXO 24 is detected. When the gradient noise is exceeded, UXO 24 may be detected and further analysis is required. In the exemplary embodiment, the gradient noise for any single gradiometer output determined from the difference of two magnetometer signals is computed using the formula $G=(2)^{1/2}$ (N/L). In this expression, N is the noise of an individual magnetometer. However, it should be appreciated that in other various exemplary embodiments the gradient noise, G, may be any other suitable value depending on the number of magnetometers and the configuration of the gradiometer 10. More specifically, for n magnetometers generating a gradient output, each having noise N and being separated by baseline L, the gradient noise, G, is computed using the formula $G=(n)^{1/2}$ (N/L). The processing circuit 130 also computes inversion algorithms, standard deviations and generates reports in the form of electrical voltages representing signals and sends them from the input/output circuit 110 to the display 180. The report indicates that a UXO 24 target is in the field of view but no tracking solution is yet available, or it indicates the position of the UXO 24 target.

Figure 7:
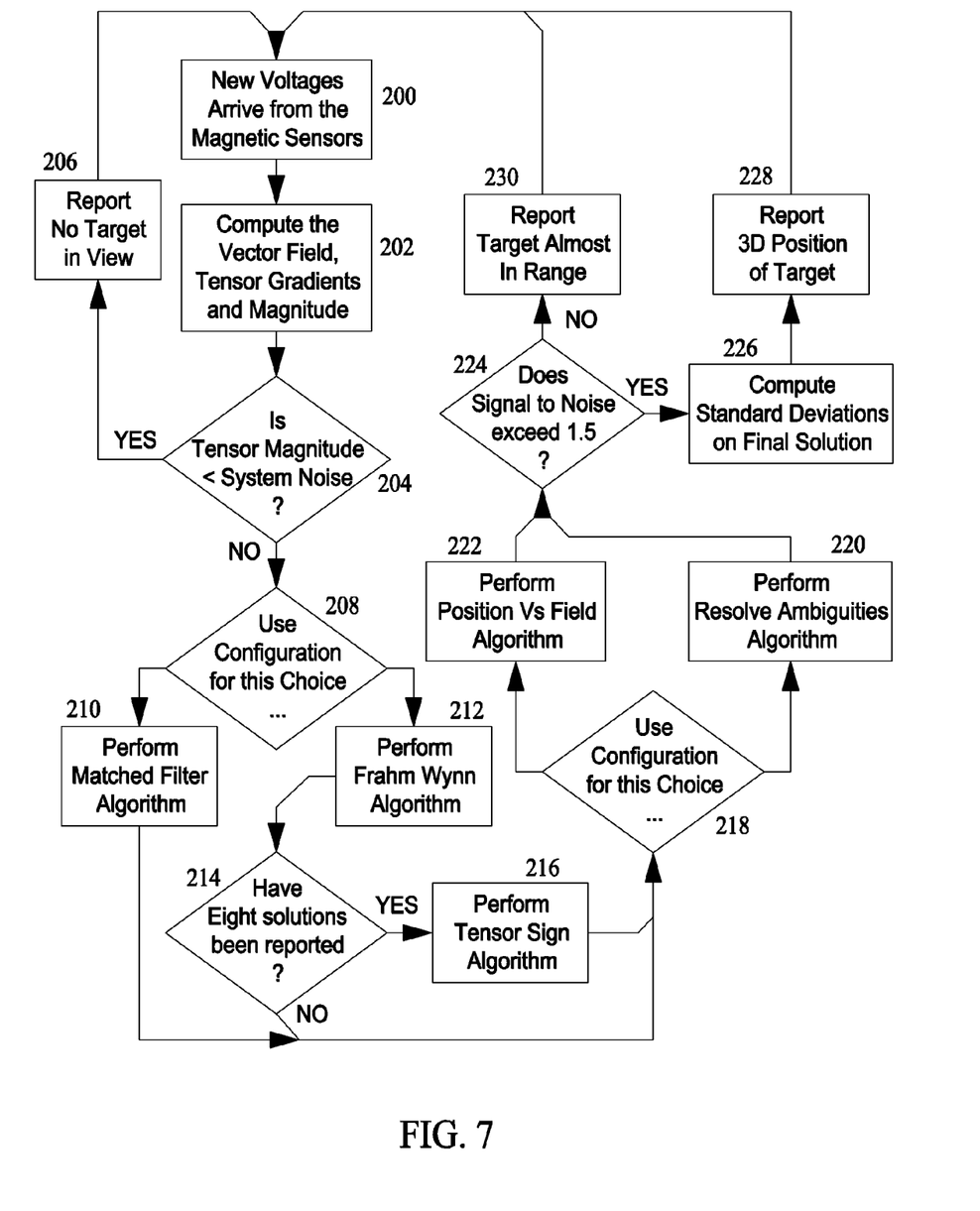
FIG. 7 is a flowchart of an exemplary embodiment of the invention for determining the location and classification of an object.

FIG. 7 is a flowchart outlining one exemplary embodiment of a system for determining the location and classification of targets such as, but not limited to, unexploded artillery shells or UXO 24. The targets may be any size UXO 24, from large-caliber bullets to 155 mm artillery shells to 2000-pound bombs. Generally, the size of an object's dipole moment, defined as the linear scaling giving the field strength at a given distance from the object, increases with the volume of the object.

Beginning at step 200, the gradiometer 10 sends a simultaneous set of voltages generated by the individual magnetometers 12, 14, 16 to the memory 130 of the controller 100. Specifically, the input/output device 110 of the controller 100 receives the simultaneous set of voltages representing the output of the gradiometer 10, including magnetic field data and related gradients, from the operating electronics of the gradiometer 10. In the exemplary embodiment the magnetometers 12, 14, 16 operate digitally, and may be internally controlled using a digital signal processor (DSP) or a field programmable gate array (FPGA). Consequently, the output voltages received by the input/output device 110 of the controller 100 are in digital form, rather than analog, and don't require conversion to digital form in the processing circuit 120. However, in other various exemplary embodiments these voltages may represent analog signals which would be digitized in the processing circuit 120 and then stored in the memory 130, with care taken to record all the data generated by the individual magnetometers synchronously to avoid errors introduced by disparate timing. After the gradiometer 10 data is stored in memory 130, operation continues to step 202.

At step 202, the magnetic vector field, the magnetic gradient tensors and the tensor magnitudes are computed from the simultaneous set of voltages received at the input/output circuit 110. These computations are well-known to one of ordinary skill in the art, so they are not discussed in detail herein. Operation then proceeds to step 204.

At step 204 the magnetic tensor magnitude is compared with the gradient noise. Specifically, the tensor magnitude is compared with the gradient noise to determine whether the tensor magnitude is less than the gradient noise. In the exemplary embodiment, the gradiometer 10 includes high quality fluxgate magnetometer sensors 12, 14, 16, and each magnetometer 12, 14, 16 has an instrumental noise level at low frequency of approximately $10pT/(Hz)^{1/2}$ ($10^{-11}$ tesla/$(Hz)^{1/2}$. In another exemplary embodiment, commercial grade magnetoresistive magnetometers may be used and they exhibit noise of about $1 nT/(Hz)^{1/2}$ ($10^{-9}$ $T/(Hz)^{1/2}$. A gradient signal formed by the difference of two magnetometer sensors 12, 14, 16 with uncorrelated instrumental noise N and separated by distance L exhibits instrumental noise of $(2)^{1/2}$(N/L). For example, when L=0.3m and $N=10^{-11}$ $T/(Hz)^{1/2}$, the gradient noise $G=4.7\times10^{-11}$ $(T/m)/(Hz)^{1/2}$. When the tensor magnitude is less than the gradient noise, operation proceeds to step 206. At step 206, a message is shown on the display 180 indicating that there is no target in the field of view. Operation returns to step 200 for analyzing a new set of data. When the tensor magnitude is equal to or greater than the gradient noise, operation proceeds to step 208.

At step 208, while the location and characterization system is running, a user interactively decides between using the Matched Filter algorithm and the Frahm-Wynn algorithm. Each of these algorithms converts the magnetic gradient tensors into four equally feasible pairs of solutions including a potential bearing unit vector $\hat{P}_i$ and corresponding scaled moment bearing $\tilde{M}_i=s\hat{M}_i$, where i=1 to 4 and s is the same scaling constant described. The potential bearings, $\hat{P}_i$, and associated moments $\tilde{M}_i$ satisfy the physics constraint $G \approx \nabla \tilde{B}_i^T$, where $\tilde{B}_i$ is the magnetic field distribution implied by solution candidate i. That is, $\tilde{B}_i$ is proportional to the magnetic field predicted by solution i of the gradients obtained by using the data collected by the magnetometers 12, 14, 16 of the gradiometer 10. As used herein, the carrot symbol "^" is used to identify a vector of unit length, and superscript T is merely the transpose operator. The tilde symbol "~" indicates that the field is proportional to the actual field, because the true distance to the target is unknown. $\tilde{B}_i$ may also be considered one of the magnetic field vectors that give the correct gradient and is determined using the following formula:

$$\tilde{B}_i = (3\hat{P}_i\tilde{M}_i^T\hat{P}_i - \tilde{M}_i\hat{P}_i^T\hat{P}_i)/|\hat{P}_i|^5 \text{ for all } i=1 \text{ to } 4.$$

The Frahm-Wynn approach inverts gradient equations. The Matched-Filter approach finds the best correlation to the possible signal. Both algorithms are well known to one of ordinary skill in the art for converting magnetic dipoles, so their details are not discussed here. Details regarding the Frahm-Wynn algorithm may be found in Carl E. Baum's book entitled DETECTION AND IDENTIFICATION OF VISUALLY OBSCURED TARGETS, published in 1999, on pages 337-374. For details regarding the Matched-Filter algorithm see, for example, U.S. Pat. No. 5,731,996. It should be appreciated that although the exemplary embodiment allows the user to interactively choose an algorithm, other various exemplary embodiments may predetermine the desired algorithm. When the user decides to use the Matched Filter algorithm, operation proceeds to step 210. Otherwise, operation proceeds to step 212 to use the Frahm-Wynn algorithm. The following discussion describes operation proceeding to step 210, then describes operation proceeding to step 212.

When the user decides to use the Matched-Filter algorithm operation proceeds to step 210. At step 210, the Matched-Filter algorithm calculates four solutions and operation proceeds to step 218.

At step 212, the Frahm-Wynn algorithm is calculated. The computational flow implies the possibility of eight solutions. That is, four positive and four negative roots as solutions. The additional four negative roots are only present because implementation of the Frahm-Wynn algorithm ignores the sign of the tensor data. After determining the results of the Frahm-Wynn algorithm, operation proceeds to step 214 where a determination is made regarding the number of solutions. The four negative roots, or solutions, do not correspond to physical locations. So, when the Frahm-Wynn algorithm computes eight solutions, operation proceeds to sign verification step 216 where the four negative roots are eliminated using a tensor sign algorithm. Operation then proceeds to step 218. When the Frahm-Wynn algorithm does not generate eight solutions, operation proceeds from step 214 to step 218.

The four solutions provided by both the Frahm-Wynn algorithm and the Matched-Filter algorithm include one pair ($\hat{P}_i$, $\tilde{M}_i$) of correct solutions and three pair of incorrect, or "ghost" solutions. $\hat{P}_i$ is a unit direction vector from the centroid 18 of the gradiometer 10 toward the dipole position of the UXO 24. $\tilde{M}_i$ is a scaled orientation vector for the axis of the magnetic dipole of the UXO 24. In one exemplary embodiment the correct solution is determined using an algorithm called "Perform ResolveAmbiguities". In another exemplary embodiment the correct solution is determined using an algorithm called "Perform PositionVsField". At step 218, a user interactively selects the algorithm most appropriate for determining the correct potential bearing-moment pair. When the user prefers using the Perform ResolveAmbiguities algorithm operation proceeds to step 220. Otherwise, operation proceeds to step 222. It should be appreciated that although the exemplary embodiment allows users to interactively choose an algorithm, other various exemplary embodiments may predetermine the desired algorithm. The following discussion describes operation proceeding to step 220, then describes operation proceeding to step 222.

At step 220, in the exemplary embodiment of the Perform ResolveAmbiguities algorithm, a correlation coefficient, C, is determined according to the equation $C=(B^T\tilde{B}_i)/(\tilde{B}_i^T\tilde{B}_i)$, where $(B^T\tilde{B}_i)$ and $(\tilde{B}_i^T\tilde{B}_i)$ are both dot products. This computes the correlation between the measured magnetic field, $B^T$, and the predicted scaled magnetic field, $\tilde{B}_i$, and uses the largest correlation as the solution. The other solutions corresponding to lower correlation coefficients are discarded. In this equation $\tilde{B}_i$ is the magnetic field distribution implied by solution candidate i. The correlation coefficient is solved for each i=1 to 4 and the value of i corresponding to the highest correlation coefficient is the correct solution, denoted imaxcor, thus, also determining the correct position bearing, $\hat{P}_{imaxcor}$, and moment bearing, $\tilde{M}_{imaxcor}$, pair.

The location bearing, $\hat{P}_{imaxcor}$, and the scaled moment, $\tilde{M}_{imaxcor}$, provide a bearing vector to the UXO 24 and the correct alignment of the magnetic moment, but not the distance to the UXO 24. The distance to the UXO 24 is given by the equation $r=(|B|(36k^2+18)^{1/2})/(|G|(3k^2+1)^{1/2})$ where $|B|$ is the scalar magnitude of the measured magnetic field, $|G|$ is the scalar magnitude of the measured magnetic gradient and the parameter k is defined by:

$$k=(\hat{P}_{imaxcor}^T \hat{M}_{imaxcor})/(\tilde{M}_{imaxcor}^T \tilde{M}_{imaxcor}).$$

Additionally, it should be understood that r has dimensions of length. The Perform ResolveAmbiguities algorithm applies a range correction to the selected solution by defining the actual dipole moment as $M=r^4 \tilde{M}_{imaxcor}$ and the actual location as $P=r\hat{P}_{imaxcor}$. The correct magnetic moment, M, is the characterization of the object or UXO 24. Particular objects have certain magnetic moments. For example, the magnetic moments of objects such as a tank and truck generally differ by a factor of three. Using the magnetic moment, M, of the exemplary embodiment, the objects cannot be precisely identified but they can be characterized such that they might be distinguished from each other on a battlefield. Operation then proceeds to step 224.

When the user decides to use the PositionVsField algorithm, operation proceeds to step 222. The PositionVsField algorithm is appropriate where the prior prediction D of the dipole magnitude, given by $|M|=D$, is more accurate than the signal to noise ratio of the first constraint. That is, the signal to noise ratio could be poor and there are cases where the prediction has a better signal to noise ratio than the actual signal to noise ratio. This method uses the unit vector of the moment to predict a dipole magnitude versus the magnetic field. This method assumes a different magnetic moment for a different type of UXO 24, and assumes a distance to UXO 24. At step 222, the PositionVsField algorithm determines a residue using a least-squares fit method given by res=$(B-r_i \tilde{B}_i)^n$, where $r_i=(D/|\tilde{M}_i|)^{1/4}$, n is an even positive number usually 2, and i=1 to 4. It should be understood that in the PositionVsField algorithm, $r_i$, is a dimensionless scale factor. The residue, res, is computed for each value of i and the value of i corresponding to the smallest computed value of the residue, denoted iminres, determines the correct solution. As in the Perform ResolveAmbiguities algorithm, the PositionVsField algorithm also applies a range correction to the selected solution by defining the actual location vector as $P=r_{iminres}\hat{P}_{iminres}$. It should be understood that the dipole moment magnitude is defined as $|M|=D$, as an a priori assumption. Operation then proceeds to step 224.

At step 224, the signal to noise ratio of the solution is computed. In the exemplary embodiment, the preferred value of the signal to noise ratio is 1.5. When the computed signal to noise ratio of the solution exceeds 1.5 operation proceeds to step 226. Otherwise, operation proceeds to step 230 where a message is shown on the display 180 that a target is almost in range and then operation proceeds to step 200 where more data is received and analyzed.

At step 226, the standard deviations of the solution are computed, yielding a tolerance distance around the predicted UXO 24 location. Operation then proceeds to step 228 where a message is shown on the display 180 reporting the three dimensional location of the UXO 24 target, and then operation proceeds to step 200 where more data is received and analyzed.

The exemplary embodiments of the locating and characterizing system discussed referencing the flowchart of FIG. 7, do not only apply to moving sensors past fixed targets such as UXO 24. It should be appreciated that in other various exemplary embodiments, the detection algorithm including the ResolveAmbiguities algorithm and the PositionVsField algorithm, applies equally well to the case of a sensor disposed in a fixed location for locating, tracking and classifying a moving target. The moving targets include, but are not limited to, vehicles and concealed handguns within range of the sensor. For example, a sensor may be hidden in a building under a plant in a kiosk and used for tracking a concealed handgun. The location of the concealed handgun is accurate despite the building steel in the walls and floor.

Other various exemplary embodiments are not limited to having the sensors move at a constant velocity, that is speed and direction, past UXO 24, or where a moving target moves at a constant velocity past a stationary sensor. The constant velocity scenario arithmetic operations are easiest to illustrate.

Described herein is a computationally non-intensive method and system, implemented in real time, for locating and characterizing any object having an associated magnetic field. The method is particularly useful for eliminating spurious unexploded ordnance identifications and locations. Due to its real time implementation, less labor is required to locate and more accurately characterize unexploded ordnance 24. Further, because this method more accurately locates and characterizes unexploded ordnance 24, fewer false locations are made and excavated, yielding additional cost savings.

Also as described herein, the method and system solves the range-moment ambiguity and eliminates the ghost solutions by combining magnetic gradient data with magnetic field data collected simultaneously and at the same location. In doing so, eight measurements are available to solve for the six unknowns. As noted above, the gradiometers 10 may be used in two states, moving and stationary. Moving gradiometers 10 locate and characterize stationary targets unambiguously. Stationary gradiometers 10 may also be used for vehicle tracking and characterization. The gradiometers 10 may be used for numerous applications including vehicle tracking, detection of buried UXO 24 and mines, detection of underground structures, and concealed weapons detection and tracking.

The magnetic method and system described herein is impervious to weather and does not require a line of sight. With appropriate water-proofing, the gradiometers 10 can be used for underwater applications. A number of commercial applications are also possible.

While the invention has been described in terms of various specific embodiments, those skilled in the art will recognize that the invention can be practiced with modification within the spirit and scope of the claims.

What is claimed is:

1. A method for determining a location and characterization of an object using a magnetic gradient tensor measurement of the object, said method comprising:
   determining an object magnetic field candidate predicted from one of an object measured magnetic field gradient and an assumed object magnetic moment magnitude;
   determining an object vector location and an object vector magnetic moment by combining the object magnetic field candidate with an object measured magnetic field;
   determining a plurality of magnetic field candidates, each of the plurality of magnetic field candidates predicted from one of the object measured magnetic field gradient and the assumed object magnetic moment magnitude; and
   computing a plurality of correlation coefficients, each of the plurality of correlation coefficients corresponding to a different one of the plurality of magnetic field candidates and the object measured magnetic field, wherein each of the plurality of correlation coefficients is calculated according to the formula $C=(B^T\tilde{B}_i)/(\tilde{B}_i^T\tilde{B}_i)$ where C is a correlation coefficient, $B^T$ is a measured magnetic field, $\tilde{B}_i$ is the predicted $i^{th}$ magnetic field candidate and i is a number of candidates.

2. A method in accordance with claim 1 further comprising selecting a largest one of the plurality of correlation coefficients, wherein the object vector location and the object vector magnetic moment correspond to the magnetic field candidate generating the largest one of the plurality of correlation coefficients.

3. A method in accordance with claim 1 further comprising determining a distance to the object according to the formula:

$$r=(|B|(36k^2+18)^{1/2})/(|G|(3k^2+1)^{1/2})$$

where r is a distance to the object, |B| is a scalar magnitude of the object measured magnetic field, |G| is a scalar magnitude of the object measured magnetic field gradient and k is a constant defined by $k=(\hat{P}_i^T\tilde{M}_i)/(\tilde{M}_i^T\tilde{M}_i)$.

4. A method in accordance with claim 3 further comprising computing k for each i, where i=1 to 4, and determining a final value of k corresponding to the value of i corresponding to a maximum correlation coefficient.

5. A method in accordance with claim 1 further comprising determining each predicted magnetic field candidate according to the formula $$\tilde{B}_i=(3\hat{P}_i\tilde{M}_i^T\hat{P}_i-\tilde{M}_i\hat{P}_i^T\hat{P}_i)/|\hat{P}_i|^5 \text{ for all i=1 to 4}$$

where $\tilde{B}_i$ is a predicted magnetic field candidate, $\hat{P}_i$ is an object predicted vector bearing, $\tilde{M}_i$ is an object predicted scaled moment and i is a number of candidates.

6. A method in accordance with claim 1 further comprising computing a plurality of residues, each of the plurality of residues corresponding to the predicted object magnetic field candidate and the object measured magnetic field and selecting a smallest one of the plurality of residues, wherein the object vector location and the object vector magnetic moment correspond to the smallest one of the plurality of residues.

7. A method in accordance with claim 6 wherein each of the plurality of residues is calculated according to the formula:

$$res=(B-r_i\tilde{B}_i)^n,$$

where res is the residue, B is a object measured magnetic field, $\tilde{B}_i$ is the predicted magnetic field candidate and $r_i$ is specified by $r_i=(D/|\tilde{M}_i|)^{1/4}$, where D is an assumed magnetic moment magnitude and $\tilde{M}_i$ is an object predicted scaled moment of the $i^{th}$ solution.

8. A method in accordance with claim 4 further comprising determining the object vector location according to the formula $P=r\hat{P}_i$ where P is the object vector location, r is the distance to the object and $\hat{P}_i$ is the predicted object vector location, and selecting a value of $\hat{P}_i$ corresponding to a value of i corresponding to a maximum correlation coefficient.

9. A method in accordance with claim 1 further comprising determining the object vector magnetic moment according to the formula $M=r^4\tilde{M}_i$, where M is the object vector magnetic moment, r is a distance to the object and $\tilde{M}_i$ is an object predicted scaled moment.

10. A system for locating and characterizing an object, the system comprising:
    a gradiometer, the gradiometer having a plurality of sensors;
    a display; and
    a controller for determining an object vector location and an object magnetic moment, wherein the controller calculates a plurality of correlation coefficients correponding to an object predicted magnetic field candidate and an object measured magnetic field, wherein each of the plurality of correlation coefficients is calculated according to the formula $C=(B^T\tilde{B}_i)/(\tilde{B}_i^T\tilde{B}_i)$ where C is a correlation coefficient, $B^T$ is a measured magnetic field, $\tilde{B}_i$ is a predicted $i^{th}$ magnetic field candidate and i is a number of candidates.

11. A system in accordance with claim 10 wherein the controller selects a largest one of the plurality of correlation coefficients and chooses the object vector location and the object magnetic moment corresponding to the largest one of the plurality of correlation coefficients.

12. A system in accordance with claim 10 wherein the controller determines whether a gradient noise exceeds a predetermined threshold value, when the gradient noise exceeds the predetermined threshold value the controller sends a message to a display that the object is almost in range, when the gradient noise is less than the predetermined threshold value the controller sends a message to the display reporting a position of the object.

13. A system in accordance with claim 10 wherein the gradiometer has at least three sides.

14. A system in accordance with claim 10 wherein the controller calculates a plurality of residues, each of the plurality of residues corresponds to the object predicted magnetic field candidate and the object measured magnetic field, and chooses the object vector location and the object magnetic moment of the object corresponding to a smallest one of the plurality of residues.

15. A system in accordance with claim 10 wherein the object includes one of a moving vehicle, an unexploded ordnance and a concealed weapon.

16. A system in accordance with claim 10 wherein a distance to the object is determined according to the formula:

$$r=(|B|(36k^2+18)^{1/2})/(|G|(3k^2+1)^{1/2})$$

where r is the distance to the object, |B| is a scalar magnitude of the object measured magnetic field, |G| is a scalar magnitude of an object measured magnetic measured gradient and k is a constant defined by $k=(\hat{P}_i^T\tilde{M}_i)/(\tilde{M}_i^T\tilde{M}_i)$.

17. A computer program embodied on a computer readable medium for locating and characterizing an object, the computer program being comprised of instructions, which when read and executed by a controller, cause the controller to determine an object vector location and an object magnetic moment by combining an object predicted magnetic field candidate with an object measured magnetic field, wherein the controller computes a plurality of correlation coefficients, each of the plurality of correlation coefficients corresponding to the object predicted magnetic field candidate and the object measured magnetic field, wherein the correlation coefficient is calculated according to the formula $C=(B^T\tilde{B}_i)/(\tilde{B}_i^T\tilde{B}_i)$ where C is the correlation coefficient, $B^T$ is a measured magnetic field, $\tilde{B}_i$ is a predicted $i^{th}$ magnetic field candidate and i is a number of candidates.

18. A computer program in accordance with claim 17 wherein the controller selects a largest one of the plurality of correlation coefficients, wherein the object vector location and the object magnetic moment correspond to the largest one of the plurality of correlation coefficients.

19. A computer program in accordance with claim 17 wherein the controller:
computes a plurality of residues, each of the plurality of residues corresponding to the object predicted magnetic field candidate and the object measured magnetic field;
selects a smallest one of the plurality of residues; and
chooses the object vector location and the object magnetic moment corresponding to the smallest one of the plurality of residues.

20. A method in accordance with claim 19 wherein each of the plurality of residues is calculated according to the formula:

$$res=(B-r_i\tilde{B}_i)^n,$$

where res is the residue, B is the object measured magnetic field, $\tilde{B}_i$ is the predicted magnetic field candidate and $r_i$ is specified by $r_i=(D/|\tilde{M}|)^{1/4}$, where D is an assumed magnetic moment magnitude and $\tilde{M}_i$ is a scaled predicted object moment magnitude of an $i^{th}$ solution.

* * * * *